United States Patent
Yokokawa et al.

(10) Patent No.: US 6,312,797 B1
(45) Date of Patent: Nov. 6, 2001

(54) METHOD FOR MANUFACTURING BONDED WAFER AND BONDED WAFER

(75) Inventors: Isao Yokokawa; Kiyoshi Mitani, both of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/350,143

(22) Filed: Jul. 9, 1999

(30) Foreign Application Priority Data

Jul. 10, 1998 (JP) .................................................. 10-195955

(51) Int. Cl.$^7$ .................................................. H01L 21/34
(52) U.S. Cl. .................. 428/336; 428/446; 428/701; 428/702; 438/455; 438/459; 438/974
(58) Field of Search ..................................... 428/446, 701, 428/702, 336; 438/455, 459, 974

(56) References Cited

U.S. PATENT DOCUMENTS

| | | |
|---|---|---|
| 5,232,870 | 8/1993 | Ito et al. . |
| 5,374,564 | * 12/1994 | Bruel ...................................... 437/24 |
| 5,773,355 | 6/1998 | Inoue et al. . |
| 5,966,620 | * 10/1998 | Sakaguchi ............................ 438/455 |
| 6,083,324 | * 7/2000 | Henley et al. ....................... 148/33.2 |

FOREIGN PATENT DOCUMENTS

| | | |
|---|---|---|
| 476897 | 3/1992 | (EP) . |
| 60-50970 | 3/1985 | (JP) . |
| 5-46086 | 7/1993 | (JP) . |
| 5211128 | 8/1993 | (JP) . |

OTHER PUBLICATIONS

Maleville et al., "Wafer Bonding and H–Implantation Mechanisms Involved in the Smart–Cut® Technology", Material Science and Engineering B, vol. 46, Nos. 1–3, Apr. 1, 1997, pp. 14–19.

Fujimo et al., "Silicon Wafer Direct Bonding Through the Amorphous Layer", Japanese Journal of Applied Physics, vol. 34, No. 10B, Part 02, Oct. 15, 1995, pp. L1332–L1324.

* cited by examiner

*Primary Examiner*—Archene Turner
(74) *Attorney, Agent, or Firm*—Greenblum & Bernstein, P.L.C.

(57) ABSTRACT

The object of the invention is to provide a bonded wafer in which an inferior bonding state of the bonded wafer attained by a hydrogen ion delamination method is reduced, no separation or no void is found at the connecting interface under a superior production characteristic and in a low cost. In a method for manufacturing a bonded wafer by a hydrogen ion delamination method, carbon concentration at a close contacted surface where both wafers are closely contacted from each other is $3-10^{14}$ atoms/cm$^2$ or less.

9 Claims, 1 Drawing Sheet

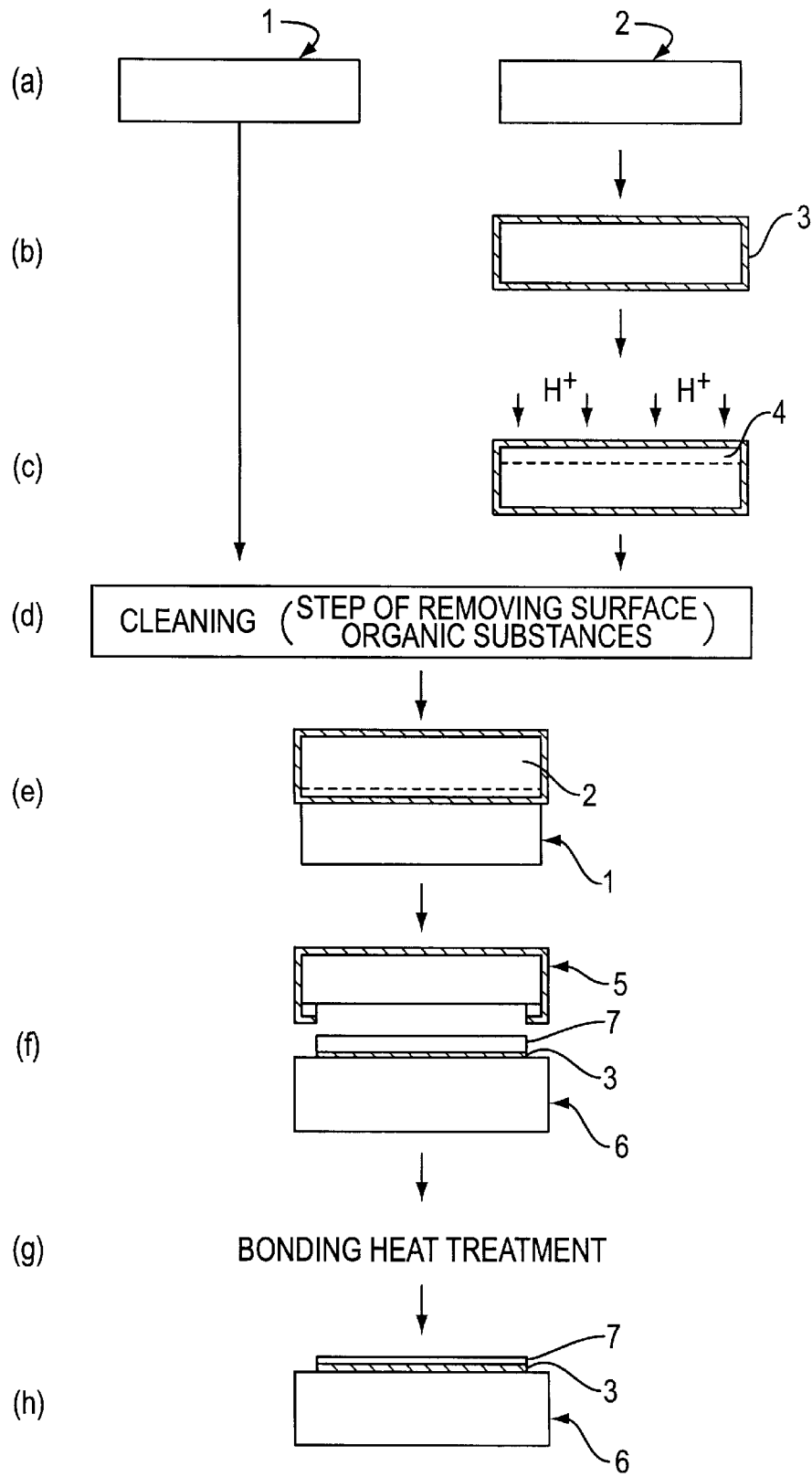
FIGURE

METHOD FOR MANUFACTURING BONDED WAFER AND BONDED WAFER

BACKGROUND OF THE INVENTION

1. Field of the Invention

This invention relates to a method for reducing an inferior bonding at a joint surface in a so-called hydrogen ion delamination (separation) method (also called as a smart-cut method) in which joined SOI wafers, at least one wafer being ion implanted, are heat treated to cause separation to SOI wafers and delaminated wafers, thereafter the SOI wafers are heat treated to make bonding firmly.

2. Description of the Related Art

As a method of manufacturing an SOI (silicon on insulator) wafer under application of a bonding method, it has been well known in the related art to provide a technology for bonding two silicon wafers through a silicon oxide film, for example, a method for forming an oxide film on at least one wafer, closely contacting these wafers to each other without placing any foreign materials at the joint surface, thereafter heat treating them at a temperature of about 200 to 1200° C. to increase a bonding strength, as disclosed in the gazette of Japanese Patent Publication No. Hei 5-46086.

The bonded wafer of which bonding strength is increased through performing a heat treatment is enabled to be ground and polished after the treatment, so that the wafer applied to form an element is reduced in its thickness to a desired thickness under grinding and polishing operations and then it is possible to form the SOI layer forming an element.

The bonded SOI wafer made in this way has some advantages that it has a superior crystalline characteristic of the SOI layer and a high reliability in an buried oxide layer present just below the SOI layer. However, it was made thin through grinding and polishing, resulting in that it took much time for making a thin film, useless application of material was set and uniformity of film thickness of only about ±0.3 μm of a target film thickness was attained.

In turn, with a recent trend of high integration and high speed in operation of semiconductor devices, it is required to have further reduction in the thickness of the SOI layer and a uniformity of film thickness and more practically, it is required to have a film thickness and its uniformity of about 0.1±0.01 μm.

Realization that the thin film SOI wafers having such a film thickness as above and a uniform film thickness by a bonded wafer was impossible under a thickness reducing work through the related art grinding and polishing, so that as a new thin film forming technology, a method called as a hydrogen ion delamination (separation) method (also called as a smart cut method) disclosed in the gazette of Japanese Patent Laid-Open No. Hei 5-211128 has been developed.

This hydrogen ion separation method is a technology on which an oxide film is formed on at least one of the two silicon wafers, either hydrogen ion or rare gas ion is implanted from the upper surface of one silicon wafer, a fine air bubble layer (enclosing layer) is formed in the silicon wafer, thereafter the ion implanted surface is closely contacted with the other wafer through the oxide film, a heat treatment (a separation heat treatment) is applied, one wafer is delaminated in a thin film state with the fine air bubble layer being applied as an separation surface (a delaminating surface), and further a heat treatment (a bonding heat treatment) is applied and they are forcedly bonded to each other to make an SOI wafer.

This method has an advantage that the material can be used effectively due to the fact that the delaminating surface is a superior mirror surface and the SOI wafer having a quite high uniform characteristic of the SOI layer can be attained in a relative easy manner and further the delaminated one wafer can be utilized again.

In addition, this method also enables the silicon wafers to be directly bonded to each other without applying any oxide film, and this is used not only for a case in which the silicon wafers are bonded to each other, but also a case in which insulator wafers having different thermal expansion coefficients such as quartz, silicon carbide and alumina or the like after implanting ions into the silicon wafers.

In the case that the bonded wafers are made by such a hydrogen ion separation method, it is also possible to perform a heat treatment of high temperature also acting as a separation heat treatment and a bonding heat treatment at once as a post heat treatment after the two wafers are closely contacted to each other at a room temperature, although it is normally carried out that for a sake of convenience in use of the delaminated wafer after its heat treatment, the separation heat treatment is once carried out at a relative low temperature of about 500° C., the delaminated wafer is recovered, only the SOI wafer is separately processed in a bonding heat treatment at a high temperature of about 1100° C., for example.

However, the present inventors found that the following two kinds of inferior bonding occurred frequently while the bonded wafer was being made in repetition by the hydrogen ion separation method.

1) Inferior bonding in which after performing the separation heat treatment, delaminated state does not occur at the ion implanted layer, but either an entire surface or its part is separated at the close contacted portions (joint surface):

2) Inferior bonding in which although a void (a partial unbonded portion) is not generated at all after performing a separation heat treatment, but void is generated after performing a bonding heat treatment.

In regard to the aforesaid two kinds of inferior bondings, the present inventors studied them honestly and found that these inferior bondings had a certain relation with a concentration of organic substances contained in the surfaces closely contacted to each other at a room temperature.

Further, describing it in detail, it is assumed that the phenomenon in which the organic substances may become a cause of void is generated in the case that the organic substances trapped at the joint surface are processed by a high temperature bonding heat treatment to become gasified, and if its gas pressure is superior to a bonding strength or rigidity of silicon, void is formed. Accordingly, in the case of the related art bonding method, since it is normally found that the bonded wafer is not made thin when a bonding heat treatment is carried out, if the wafer has a high rigidity and a relative small amount of organic substances is trapped at the joint surfaces, they may not become gasified and formed as void and they are diffused and diminished from the joint surface.

To the contrary, in the case of hydrogen ion delamination method, since a high temperature bonding heat treatment is carried out at the SOI layer after the separation heat treatment under a state of quite thin thickness of 2 μm or less, the present inventors have found that rigidity of wafer is quite weak and even if such a small amount of organic substances trapped at the joint surface as one not producing any void under the related art bonding method is present, there occurs a phenomenon in which the void is generated only after the bonding heat treatment is carried out, as described in the above item 2).

In turn, the present inventors have found that occurrence of inferior bonding is dependent on a presence or a non-presence of a silicon oxide film or its thickness at the close contacted surfaces of the wafers. That is, if the bonding is performed through an oxide film, the gas generated under the presence of the organic substances is absorbed into the oxide film, so that the void is hardly formed. Then, it may be considered that this phenomenon shows a certain effect as a thickness of the oxide film is thicker.

SUMMARY OF THE INVENTION

In view of the foregoing, the present invention has been attained in reference to a relation between an inferior bonding of the bonded wafers and a concentration of carbon atoms which can be an index for contamination of organic substances at the close contacted surface and it is a main object of the present invention to reduce an inferior bonding of the bonded wafers attained by the hydrogen ion delamination method and to provide the bonded wafers having no separation at the bonding interface or no void under high productivity and low cost.

In order to accomplish the aforesaid advantage, one aspect of the present invention is a method for manufacturing a bonded wafer by a hydrogen ion delamination method characterized in that carbon concentration at close contacted surfaces of both wafers is $5 \times 10^{14}$ atoms/cm$^2$ or less.

As described above, if the carbon concentration at the close contacted surfaces where both wafers are closely contacted at a room temperature is $5-10^{14}$ atoms/cm$^2$ or less, no inferior bonding and no separation occurs at the ion implanted layer after performing the separation heat treatment, and there is no separation at either the entire surface or its part at the close contacted surfaces.

In another aspect of the present invention, if carbon concentration at a joint surface after separation heat treatment is $3 \times 10^{14}$ atoms/cm$^2$ or less, it is possible to prevent a void from being generated by its subsequent bonding heat treatment.

Preferably, a thickness of a silicon oxide film present at close contacted surfaces is 0.1 μm or more, thereby the occurrence of void caused by the bonding heat treatment can be positively prevented.

In a further aspect of the present invention, if the surfaces of wafers to be bonded from each other are cleaned with ozone cleaning and/or sulfuric acid-hydrogen peroxide cleaning combined with at least one of SC-1 cleaning and SC-2 cleaning, thereafter the wafers are bonded to each other, carbon concentration at the close contacted and joint surfaces can be positively reduced to such a level that no void is generated.

Additionally, a further aspect of the invention describes a bonded wafer characterized in that carbon concentration at the joint surfaces after a separation heat treatment is $3 \times 10^{14}$ atoms/cm$^2$ or less. If such a wafer as one described above is applied, since generation of void can be prevented through high temperature bonding heat treatment, it is possible to manufacture the bonded wafers having high quality without any void in a high yield. In particular, in the case of bonded SOI wafer, it is preferable that a thickness of the silicon oxide film present at the joint surfaces is 0.1 μm or more.

As the wafer to be used for reducing an inferior bonding at the hydrogen ion separation method, it is preferable to apply a wafer having such a surface concentration as above in which carbon concentration at the close contacted surfaces of both wafers is $3 \times 10^{14}$ atoms/cm$^2$ or less. In addition, in the case of manufacturing the bonded SOI wafer, it is preferable that a thickness of the silicon oxide film present at the close contacted surfaces is 0.1 μm or more.

As described above, the present invention can suppress inferior bondings in which after performing the separation heat treatment, delamination does not occur at the ion implanted layer, but either an entire surface or its part is separated at the close contacted portions, and although a void (partial unbonded portion) is not generated after performing a separation heat treatment, but void is generated after performing a bonding heat treatment, when the bonded wafer is manufactured by hydrogen ion delamination method. Accordingly, the bonded wafer having no separation state or void at the bonding interface can be provided in a superior productivity and under a low cost.

BRIEF DESCRIPTION OF THE DRAWINGS

FIGURE is a flow chart for indicating an example of manufacturing steps for the bonded SOI wafer in accordance with the present invention.

DESCRIPTON OF THE PREFERRED EMBODIMENTS

Referring now to FIGURE, one preferred embodiment of the present invention will be described. However, the present invention is not limited to this preferred embodiment. In this case, FIGURE is a flow chart for indicating one example of manufacturing steps of the bonded SOI wafer of the present invention.

At the step (a), two silicon wafers 1, 2 are prepared, wherein both wafers are single-crystal silicon wafers in which at least surfaces to be bonded are polished in mirror surface. In this FIGURE, 1 denotes a base wafer and 2 denotes a bond wafer.

The step (b) is a step for forming an oxide film 3 at the bond wafer 2 becoming the SOI layer. Since the oxide film 3 becomes a buried oxide layer of the SOI wafer, its thickness is set in response to its application, although about 0.1 to 2.0 μm is normally applied. In addition, it is also preferable that an oxide film is not formed at the bond wafer 2, but the oxide film is formed at the base wafer 1 becoming the supporting wafer for the SOI layer and also both of them may be formed with oxide films.

Then, at the step (c), at least one of hydrogen ion or rare gas ion, hydrogen ion in this case is implanted from above the upper surface of one surface of the bond wafer 2 (a surface bonded to the base wafer 1) and then a fine air bubble layer (enclosing layer) 4 in parallel with the surface at a mean penetration depth of ion is formed, wherein it is preferable that a temperature of wafer during implantation operation is 25 to 450° C. and in particular, 200° C. or less is preferable.

At the step (d), this is a cleaning step in which surface impurities are removed before the base wafer 1 and the bond wafer 2 are closely contacted at a room temperature. This related art cleaning step was carried out such that mixed solution of ammonium hydroxide and hydrogen peroxide called as SC-1 cleaning, or mixed solution of hydrogen chloride and hydrogen peroxide called as SC-2 cleaning are applied independently or under a combination of several steps. However, in the present invention, in addition to the SC-1 cleaning or SC-2 cleaning, a combined method of a well known ozone cleaning (pure water containing ozone) or sulfuric acid-hydrogen peroxide cleaning (mixed solution of concentrated sulfuric acid and hydrogen peroxide water) is carried out in order to perform an effective removal of the organic substances at the surface. With such an arrangement as above, the organic substances at the surfaces of the base wafer 1 and the bond wafer 2 can be removed effectively, so that it is possible that a concentration of carbon at the close contacted surfaces closely contacted to each other at a room temperature is positively set to $5\times10^{14}$ atoms/cm$^2$ or less.

In addition, since a concentration of carbon at the close contacted surfaces is determined in response to cleaning conditions such as a temperature, composition and cleaning time of the cleaning liquid at the step (d), if a relation between the cleaning condition and the concentration of carbon at the close contacted surfaces is checked in advance, a cleaning condition which is most suitable for the target concentration of carbon can be set.

As a measuring method, there may be provided TD-GC-MS (Thermal Desorption Gas Chromatography Mass Spectroscopy) method or SIMS (Secondary Ion Mass Spectroscopy) under application of a thin film SOI to be described later.

Then, at the step (e), this is a step in which both wafers after their cleaning are superposed to each other and closely contacted to each other, wherein the surfaces of the two wafers are contacted to each other in a clean atmosphere at a normal temperature, thereby the wafers are closely joined to each other without using any adhesive agent or the like.

At the step (f), this is a separation heat treatment in which a delaminated wafer 5 and the SOI wafer 6 (SOI layer 7+buried oxide layer 3+base wafer 1) are separated while being delaminated with the enclosing layer 4 being applied as an interface, wherein, for example, if a heat treatment is applied at a temperature of about 500° C. or more in inert gas atmosphere, the delaminated wafer 5 and the SOI wafer 6 are separated by a rearrangement of crystals and cohesion aggregation of air bubbles and concurrently the close contacted surfaces at a room temperature are rigidly bonded to a certain degree. At this step, an analysis with SIMS (Secondary Ion Mass Spectroscopy) is carried out from the SOI surface of the SOI wafer 6 toward its depth direction, resulting in that a specified amount of concentration of carbon at the close contacted surface at a room temperature can be specified in its quantity. In addition, if a reclaiming processing in which the oxide film 3 at the surface is removed and the delaminated surface is polished is carried out, the delaminated wafer 5 can be utilized again.

In order to use the SOI wafer 6 during the device manufacturing step, a bonding strength under a separation heat treatment at the step (f) is insufficient, so that the heat treatment at high temperature is applied as a bonding heat treatment at the step (g) so as to cause the bonding strength to be sufficiently high. This heat treatment can be carried out in an atmosphere of inert gas, for example, at a temperature of about 1000 to 1200° C. for about 30 minutes to 5 hours. In addition, if a rapid heating and rapid cooling device such as a lamp heating device is applied, a sufficient bonding strength can be attained at a temperature of about 1000 to 1350° C. for a short period of 1 to 300 seconds.

Then, at the step (h), this is a step in which a damaged layer and a surface roughness present at the delaminated surface (separated surface) acting as the surface of the SOI layer 7 are removed. As this step, a polishing process called as a touch-polish having a quite less amount of stock removal or a heat treatment can be carried out in a reducing atmosphere containing hydrogen after the touch polishing operation. However, even if only the heat treatment is carried out in the reducing atmosphere containing hydrogen without performing the touch-polishing, the damaged layer and the surface roughness can be similarly removed and further it may act as the bonding heat treatment at the step (g), resulting in that a more efficient step can be assured.

Preferred Embodiment

Example 1

At first, two single-crystal silicon wafers 2 having a diameter of 150 nm, a thickness of 625 μm, a conductive p-type, and a resistivity of 10 to 20 Ω·cm with its one surface being polished in mirror surface were prepared, one of the wafers was formed as a bond wafer and an oxide film having a thickness of 0.1 μm was formed at the surface by a thermal oxidation.

Then, H+ions were implanted at the mirror surface side of the bond wafer through an oxide film under a condition of an implanting energy of 40 keV and an implanting dose $8\times10^{14}$ atoms/cm$^2$, thereafter sulfuric acid-hydrogen peroxide cleaning (96% concentrated sulfuric acid:30% $H_2O_2$=6 kg:100 cc, a liquid temperature of 110° C.) was carried out for 5 minutes, rinsed with pure water, thereafter SC-1 cleaning (29% NH4OH aqueous solution:30% $H_2O_2$, pure water=1: 1: 8, a liquid temperature of 80° C.) was carried out for 4 minutes, and further SC-1, SC-2 (36% HCl aqueous solution: 30% $H_2O_2$:pure water=1:1:6, a liquid temperature of 80° C.) and SC-1 were carried out in sequence for every 4 minutes.

In turn, SC-1, SC-2 and SC-1 cleanings were carried out in sequence for every 4 minutes without performing a sulfuric acid-hydrogen peroxide cleaning, both wafers were dried, thereafter they were closely contacted to each other at a room temperature and further as a separation heat treatment, the heat treatment at 500° C. was carried out for 30 minutes in nitrogen gas atmosphere.

As a result, the SOI wafer having a thickness of the SOI layer of about 0.25 μm and the delaminated wafer were made as shown in step (f) of Figure. Visual inspection of the SOI wafer after its separation showed that the void was not observed at all. If the SOI layer is kept at its thin-film state, the portion where the void is present is seen as a protruded shape, so that the void can be observed without using any special device.

Then, the bonding heat treatment was carried out for this SOI wafer in nitrogen gas atmosphere at 1100° C. for 2 hours. The SOI wafer after its bonding heat treatment was observed visually and no void was observed at all.

In addition, up to the separation heat treatment was carried out under the quite same condition as that of the aforesaid operation, the SOI wafer separately manufactured was diced, SIMS measurements were carried out for three portions (a portion near its center, a portion near 35 mm from its center and a portion near 65 mm from its center), carbon concentration at the close contacted surface at a room temperature was calculated to find out a value of $3\times10^{14}$ atoms/cm$^2$ or less.

Example 2

The bond wafer in which the wafer of the same kind as that of the preferred embodiment 1 was not formed with an oxide film, but ion implanted under the same condition was manufactured and kept in a desiccator containing dibutylbenzoquinone therein for 1 hour.

After this period, the cleaning with sulfuric acid-hydrogen peroxide was not carried out, but only the SC-1, SC-2 and SC-1 cleanings were carried out under the same condition as that of the preferred embodiment 1 together with the base wafer and after drying them, both wafers were closely contacted to each other at a room temperature, the same separation heat treatment and bonding heat treatment as those of the preferred embodiment 1 were carried out in sequence. As a result, several voids with a diameter of about 2 to 10 mm were generated at the SOI wafer after the separation heat treatment and their numbers at the SOI wafer were increased after the bonding heat treatment was carried out. However, a phenomenon in which the entire surface of the SOI wafer is separated after performing the separation heat treatment was not occurred.

In addition, up to the separation heat treatment was carried out under the quite same condition as that of the aforesaid operation, the bonded wafer separately manufactured was diced, SIMS measurements were carried out for three portions (a portion near its center, a portion near 35 mm from its center and a portion near 65 mm from its center), carbon concentration at the close contacted surface at a room temperature was calculated to find out a value of $5 \times 10^{14}$ atoms/cm$^2$ or less.

Example 3

Except the fact that an oxide film with a thickness of 0.1 μm was formed at the bond wafer, a plurality of SOI wafers were manufactured in which operations up to the bonding heat treatment were carried out in sequence under the same condition as that of the preferred embodiment 2. As a result, no voids were observed at all at any kinds of SOI wafers after performing the separation heat treatment, although there occurred cases in which several voids were generated after performing the bonding heat treatment and the other cases in which voids were not generated at all.

Comparative Example 1

A bond wafer in which an oxide film was not formed in the same kind of wafer as that shown in the preferred embodiment 1 and ion implantation was carried out under the same condition was manufactured, and kept in a desiccator containing dibutylbenzoquinone therein for 6 hours.

After this period, the cleanings SC-1, SC-2 and SC-1 were carried out in sequence under the same condition as that of the preferred embodiment 1 only for the base wafer and after drying them, both wafers were closely contacted to each other at a room temperature, the same separation heat treatment as that of the preferred embodiment 1 was carried out.

As a result, entire surfaces of both wafers after separation heat treatment were separated at an interface closely contacted at a room temperature and no delamination of the wafer at the ion implanted layer was found.

In addition, after a silicon layer of about 0.3 μm was deposited at 600° C. in a reduced pressure by a vapor phase growth apparatus after the surface of the bond wafer had been processed up to the step keeping it in a container under the quite same condition as the foregoing. Then SIMS measurement was carried out in the same manner as those of the preferred embodiments 1 and 2, carbon concentration at the surface of the bond wafer was calculated to find out a value of $5 \times 10^{14}$ atoms/cm$^2$ or higher.

Comparative Example 2

Except the fact that an oxide film with a thickness of 0.1 μm was formed at the bond wafer, operations up to the separation heat treatment were carried out under the same condition as that of the comparative example 1. As a result, a part of the interface closely contacted at a room temperature was separated.

Further, the present invention is not limited to the aforesaid preferred embodiments. The aforesaid preferred embodiments are illustrative, and have a substantial same configuration as that of the technical concept described in the claims of the present invention and so any type of embodiments showing the similar actions and effects are included in the technical scope of the present invention.

For example, although the manufacturing step for the SOI wafer of the present invention is illustrated in Figure. for the case in which the oxide film is formed only at the bond wafer, it may also be applicable that the oxide film is formed only at the base wafer or oxide films may be formed at both wafers. In addition, the present invention may be adapted for the case in which it is bonded as base wafer to insulator wafers having different thermal expansion coefficients such as polycrystalline silicon or quartz, silicon carbide, alumina or the like.

Having described specific examples of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A method for manufacturing a bonded wafer by a hydrogen ion delamination method, comprising having a carbon concentration at close contacted surfaces of both wafers of $5 \times 10^{14}$ atoms/cm$^2$ or less.

2. A method for manufacturing a bonded wafer by a hydrogen ion delamination method, comprising having a carbon concentration at a joint surface after separation heat treatment of $3 \times 10^{14}$ atoms/cm$^2$ or less.

3. The method for manufacturing a bonded wafer according to claim 1, wherein thickness of a silicon oxide film present at close contacted surfaces is 0.1 μm or more.

4. The method for manufacturing a bonded wafer according to claim 2, wherein thickness of a silicon oxide film present at close contacted surfaces is 0.1 μm or more.

5. A method for manufacturing a bonded wafer by a hydrogen ion delamination method, wherein surfaces of wafers to be bonded to each other are cleaned with ozone cleaning and/or sulfuric acid-hydrogen peroxide cleaning combined with at least one of SC-1 cleaning and SC-2 cleaning, thereafter the wafers are bonded to each other.

6. A bonded wafer manufactured by a hydrogen ion delamination method, the bonded wafer comprising a joint surface, and carbon concentration at the joint surface after a separation heat treatment is $3 \times 10^{14}$ atoms/cm$^2$ or less.

7. The bonded wafer according to claim 6, wherein a thickness of a silicon oxide film present at a joint surface is 0.1 μm or more.

8. A wafer applied in a hydrogen ion delamination method, the wafer comprising carbon concentration at a close contacted surface where two wafers are closely contacted to each other of $5 \times 10^{14}$ atoms/cm$^2$ or less.

9. The wafer applied in a hydrogen ion delamination method according to claim 8, wherein a thickness of a silicon oxide film present at close contacted surfaces is 0.1 μm or more.

* * * * *